United States Patent
Kano et al.

(10) Patent No.: US 12,307,534 B2
(45) Date of Patent: May 20, 2025

(54) SIMULATION SYSTEM AND SIMULATION METHOD

(71) Applicant: Komatsu Ltd., Tokyo (JP)

(72) Inventors: Shinya Kano, Tokyo (JP); Noriaki Kojima, Tokyo (JP); Yoshiyuki Onishi, Tokyo (JP); Kyohei Kuroda, Tokyo (JP)

(73) Assignee: KOMATSU LTD., Tokyo (JP)

( * ) Notice: Subject to any disclaimer, the term of this patent is extended or adjusted under 35 U.S.C. 154(b) by 572 days.

(21) Appl. No.: 16/064,656

(22) PCT Filed: Mar. 30, 2017

(86) PCT No.: PCT/JP2017/013482
§ 371 (c)(1),
(2) Date: Jun. 21, 2018

(87) PCT Pub. No.: WO2017/170968
PCT Pub. Date: Oct. 5, 2017

(65) Prior Publication Data
US 2018/0374168 A1    Dec. 27, 2018

(30) Foreign Application Priority Data
Mar. 30, 2016    (JP) .................................. 2016-069781

(51) Int. Cl.
*G06F 30/13* (2020.01)
*E02F 9/20* (2006.01)
(Continued)

(52) U.S. Cl.
CPC .............. *G06Q 50/08* (2013.01); *E02F 9/20* (2013.01); *G06F 30/13* (2020.01); *G06F 30/20* (2020.01);
(Continued)

(58) Field of Classification Search
CPC ... G06Q 50/08; G06Q 10/06313; G06F 30/13
See application file for complete search history.

(56) References Cited

U.S. PATENT DOCUMENTS

| | | | | |
|---|---|---|---|---|
| 5,631,658 A | * | 5/1997 | Gudat | G05D 1/0278 701/1 |
| 6,191,732 B1 | * | 2/2001 | Carlson | E02F 3/842 342/357.3 |

(Continued)

FOREIGN PATENT DOCUMENTS

| | | |
|---|---|---|
| JP | 09-177321 A | 7/1997 |
| JP | 2002-188149 A | 7/2002 |

(Continued)

OTHER PUBLICATIONS

Kim, Sung-Keun, Jongwon Seo, and Jeffrey S. Russell. "Intelligent navigation strategies for an automated earthwork system." Automation in Construction 21 (print:2012, online:2011): 132-147 (Year: 2011).*

(Continued)

*Primary Examiner* — Rehana Perveen
*Assistant Examiner* — Cuong V Luu
(74) *Attorney, Agent, or Firm* — Troutman Pepper Locke LLP

(57) ABSTRACT

Provided is a simulation system capable of improving productivity in a construction site. The simulation system includes: a current topography data acquisition unit that acquires current topography data indicating a current topography of a construction site; a design topography data acquisition unit that acquires design topography data indicating a design topography of the construction site; a basic unit data acquisition unit that acquires basic unit data indicating specifications of resources related to construction in the construction site; a construction amount data calculation unit that calculates construction amount data indicat- (Continued)

ing a construction amount in the construction site on the basis of the current topography and the design topography; a construction condition setting unit that sets construction condition data indicating construction procedures; and a simulation unit that calculates a transition state of the construction site on the basis of the basic unit data, construction condition data, and construction amount data.

16 Claims, 12 Drawing Sheets

(51) Int. Cl.
  *G06F 30/20* (2020.01)
  *G06Q 10/06* (2023.01)
  *G06Q 10/0631* (2023.01)
  *G06Q 50/08* (2012.01)

(52) U.S. Cl.
  CPC ....... *G06Q 10/06* (2013.01); *G06Q 10/06313* (2013.01)

(56) References Cited

U.S. PATENT DOCUMENTS

| | | | |
|---|---|---|---|
| 10,684,137 B2* | 6/2020 | Kean | G06F 16/51 |
| 2002/0045986 A1 | 4/2002 | Tamaru | |
| 2002/0059320 A1 | 5/2002 | Tamaru | |
| 2005/0171790 A1* | 8/2005 | Blackmon | G06Q 10/06 705/315 |
| 2005/0268245 A1* | 12/2005 | Gipps | G06F 30/18 715/762 |
| 2006/0044307 A1* | 3/2006 | Song | G06Q 10/06398 345/419 |
| 2008/0195365 A1 | 8/2008 | Ohkura et al. | |
| 2009/0094077 A1* | 4/2009 | Fosburgh | G06Q 10/00 705/315 |
| 2010/0161183 A1* | 6/2010 | Beese | G06Q 50/02 701/50 |
| 2010/0217640 A1 | 8/2010 | Nichols | |
| 2012/0066019 A1* | 3/2012 | Hinshaw | G06Q 10/06313 705/7.23 |
| 2012/0203563 A1 | 8/2012 | Umeki et al. | |
| 2013/0197960 A1 | 8/2013 | Nichols | |
| 2014/0125651 A1* | 5/2014 | Sharp | G01C 15/00 345/419 |
| 2014/0277666 A1* | 9/2014 | Morkos | G06Q 10/06 700/100 |
| 2014/0365259 A1* | 12/2014 | Delplace | G06Q 10/063114 705/7.15 |
| 2016/0321763 A1 | 11/2016 | Shike | |
| 2017/0175364 A1* | 6/2017 | Hasegawa | G06T 11/00 |
| 2018/0137446 A1* | 5/2018 | Shike | G06Q 50/08 |
| 2019/0138667 A1* | 5/2019 | Benesh | G06Q 10/063 |
| 2020/0126464 A1* | 4/2020 | Onishi | G09G 5/377 |
| 2020/0386882 A1* | 12/2020 | Klein | G01S 13/88 |

FOREIGN PATENT DOCUMENTS

| | | |
|---|---|---|
| JP | 2002-188183 A | 7/2002 |
| JP | 2004-326369 A | 11/2004 |
| JP | 2007-177541 A | 7/2007 |
| JP | 2011-7038 A | 1/2011 |
| JP | 2011-058606 A | 3/2011 |
| JP | 2014-026548 A | 2/2014 |
| JP | 2014-134942 A | 7/2014 |
| JP | 2015-082141 A | 4/2015 |
| JP | 2016-212469 A | 12/2016 |
| JP | 2017-071916 A | 4/2017 |
| WO | 2005/106139 A1 | 11/2005 |
| WO | 2011/058606 A1 | 5/2011 |

OTHER PUBLICATIONS

Kim, Sung-Keun, and Jeffrey S. Russell. "Framework for an intelligent earthwork system: Part II. Task identification/scheduling and resource allocation methodology." Automation in construction 12, No. 1 (print:2003, online:2002): 15-27 (Year: 2002).*
Authors Unknown, AutoCAD Civil 3D 2012 User Manual, Autodesk, 2012, 31 pages (Year: 2012).*
Chae, M. J., J. R. Kim, J. H. Jang, H. S. Yoo, M. Y. Cho, and D. S. Jang. "3D imaging system for the Intelligent Excavation System (IES)." In 25th ISARC, Vilnius, pp. 286-291. 2008 (Year: 2008).*
Kim, Sung-Keun, and Jeffrey S. Russell. "Framework for an intelligent earthwork system: Part I. System architecture." Automation in Construction 12, No. 1 (print:2003, online:2002): 1-13 (Year: 2002).*
Seo, Jongwon, Seungsoo Lee, Jeonghwan Kim, and Sung-Keun Kim. "Task planner design for an automated excavation system." Automation in Construction 20, No. 7 (2011): 954-966 (Year: 2011).*
Shah, Raj Kapur. "A new approach for automation of location-based earthwork scheduling in road construction projects." Automation in construction 43 (2014): 156-169 (Year: 2014).*
Askew, W. H., S. H. Al-Jibouri, M. J. Mawdesley, and D. E. Patterson. "Planning linear construction projects: automated method for the generation of earthwork activities." Automation in construction 11, No. 6 (2002): 643-653 (Year: 2002).*
Authors Unknown, "Excavation and embankment (cut and fill)", obtained from http://www.learncivilengineering.com/wp-content/uploads/2014/06/Excavation-and-embankment-e.g.-cut-and-fill.pdf on May 3, 2022, 6 pages (Year: 2022).*
Authors Unknown, "Plans Preparation Manual, vol. 1", subsection 3.5.5 (p. 9 of chapter 3), obtained from https://www.fdot.gov/docs/default-source/roadway/ppmmanual/2016/volume1/Chap03.pdf on May 3, 2022, 2016, 1 page (Year: 2016).*
Koehrsen, Craig L., William C. Sahm, and Claude W. Keefer. "GPS-Based Earthmoving for Construction." In Digital Earth Moving, pp. 4-17. Springer, Berlin, Heidelberg, 2001. (Year: 2001).*
Dahlan Nariman et al.,"Development of a Civil Engineering Support System Using Augmented Reality", The Virtual Reality Society of Japan Dai 6 Kai Taikai Ronbunshu, Sep. 19, 2001, pp. 9-12 and English abstract thereof.
International Search Report mailed Jun. 27, 2017, issued for PCT/JP2017/013482.
Sung-Keun Kim et al., "Intelligent navigation strategies for an automated earthwork system," Automation in Construction 21, 2012, pp. 132-147.
Japanese Decision to Grant a Patent mailed Oct. 26, 2021, issued for Japanese Patent Application No. 2018-509489 and an English machine translation thereof.

* cited by examiner

FIG.7

| | MESH DIVISION | | | | |
|---|---|---|---|---|---|
| | SOIL PROPERTY SELECTION | | | | OK |
| | No. | SOIL CATEGORY | STANDARD SOIL SWELL FACTOR L | STANDARD SOIL SHRINKAGE FACTOR C | CANCEL |
| 28 → | ● 1 | SAND | 1.15 | 0.90 | |
| | ○ 2 | VISCOUS SOIL | 1.25 | 0.87 | |
| | ○ 3 | GRAVEL MIXED SOIL | 1.40 | 0.90 | |

DIVISION WIDTH

29 → XY DIRECTION [2.0 ▼] [m]

Z DIRECTION [0.4 ▼] [m]

FIG.8

HAULING ROUTE

DUMP TRUCKS CAN PASS EACH OTHER
◉ YES  ○ NO                                 ← 30

NUMBER OF DUMP TRUCKS WHICH CAN STAND BY
NEAR LOADING PLACE         NEAR UNLOADING PLACE
[0] [DUMP TRUCK(S)]        [0] [DUMP TRUCK(S)]    ← 31

(IN CASE WHERE DUMP TRUCKS CANNOT PASS EACH OTHER)
WHEN THERE IS NO AVAILABLE SPACE ON ARRIVAL SIDE,
DUMP TRUCK CANNOT START TRAVELING

CUT MAXIMUM AMOUNT              EMBANKMENT MAXIMUM
TO BE LOADED                    AMOUNT TO BE GRADED
[0.0] [m³]                      [0.0] [m²]           } 40

IN CASE OF REACHING SETTING AMOUNT OR MORE,
CONSTRUCTION MACHINE STOPS WORKING

HAULING DISTANCE IN OUTSIDE AREA
[0.0] [m²]

MEMO: DUMP TRUCK LOAD
CAPACITY
20t: 11.0 [m³]
10t: 5.5 [m³]

[OK]  [CANCEL]

ROAD SURFACE STATE                                              ← 32

| | ROAD SURFACE CATEGORY | ROAD SURFACE COEFFICIENT |
|---|---|---|
| 1 ◉ | PAVED ROAD | 1.02 |
| 2 ○ | NO GOOD ROAD SURFACE STATE | 0.90 |
| 3 ○ | PAVED ROAD HAVING 5% OR MORE OF CONTINUOUS STEEP SLOPE | 0.90 |
| 4 ○ | GRAVEL ROAD IN RELATIVELY GOOD STATE HAVING 5% OR MORE OF STEEP SLOPE | 0.85 |
| 5 ○ | NO GOOD ROAD SURFACE STATE HAVING 5% OR MORE OF CONTINUOUS STEEP SLOPE | 0.80 |
| 6 ○ | VEHICLES ARE BARELY ABLE TO PASS EACH OTHER, HOUSES ARE CONTINUOUSLY BUILT | 0.80 |
| 7 ○ | GRAVEL ROAD | 1.00 |

SIMULATION SYSTEM AND SIMULATION METHOD

FIELD

The present invention relates to a simulation system and a simulation method.

BACKGROUND

There may be a case where construction in a construction site is simulated by a computer system. Patent Literature 1 discloses a technology in which construction planning and construction management are performed by a computer system.

CITATION LIST

Patent Literature

Patent Literature 1: Japanese Laid-open Patent Publication No. 09-177321 A

SUMMARY

Technical Problem

To improve productivity in a construction site, it is desired that construction to be executed can be simulated and visualized.

An aspect of the present invention is directed to providing a simulation system and a simulation method which can improve productivity in a construction site.

Solution to Problem

According to a first aspect of the present invention, a simulation system comprises: a current topography data acquisition unit configured to acquire current topography data indicating a current topography of a construction site; a design topography data acquisition unit configured to acquire design topography data indicating a design topography of the construction site; a basic unit data acquisition unit configured to acquire basic unit data indicating specifications of resources related to construction in the construction site; a construction amount data calculation unit configured to calculate construction amount data indicating a construction amount in the construction site on the basis of the current topography and the design topography; a construction condition setting unit configured to set construction condition data indicating construction procedures; and a simulation unit configured to calculate a transition state of the construction site on the basis of the basic unit data, the construction condition data, and the construction amount data.

According to a second aspect of the present invention, a simulation method comprises: acquiring current topography data indicating a current topography of a construction site; acquiring design topography data indicating a design topography of the construction site; acquiring basic unit data indicating specifications of resources related to construction in the construction site; calculating construction amount data indicating a construction amount in the construction site on the basis of the current topography and the design topography; setting construction condition data indicating construction procedures; and calculating, on the basis of the basic unit data, the construction condition data, and the construction amount data, construction efficiency at a time of performing construction of the construction amount.

Advantageous Effects of Invention

According to an aspect of the present invention, provided are a simulation system and a simulation method which can improve productivity in a construction site.

BRIEF DESCRIPTION OF DRAWINGS

FIG. 7 is a diagram schematically illustrating exemplary construction condition data displayed on the output device according to the first embodiment.

FIG. 8 is a diagram schematically illustrating exemplary construction condition data displayed on the output device according to the first embodiment.

FIG. 11 is a diagram schematically illustrating an exemplary simulation result displayed on the output device according to the first embodiment.

DESCRIPTION OF EMBODIMENTS

In the following, an embodiment of the present invention will be described with reference to the drawings, but the present invention is not limited thereto. Note that constituent elements of the respective embodiments described below can be suitably combined. Additionally, some of the constituent elements may not be used.

First Embodiment

Figure 1:
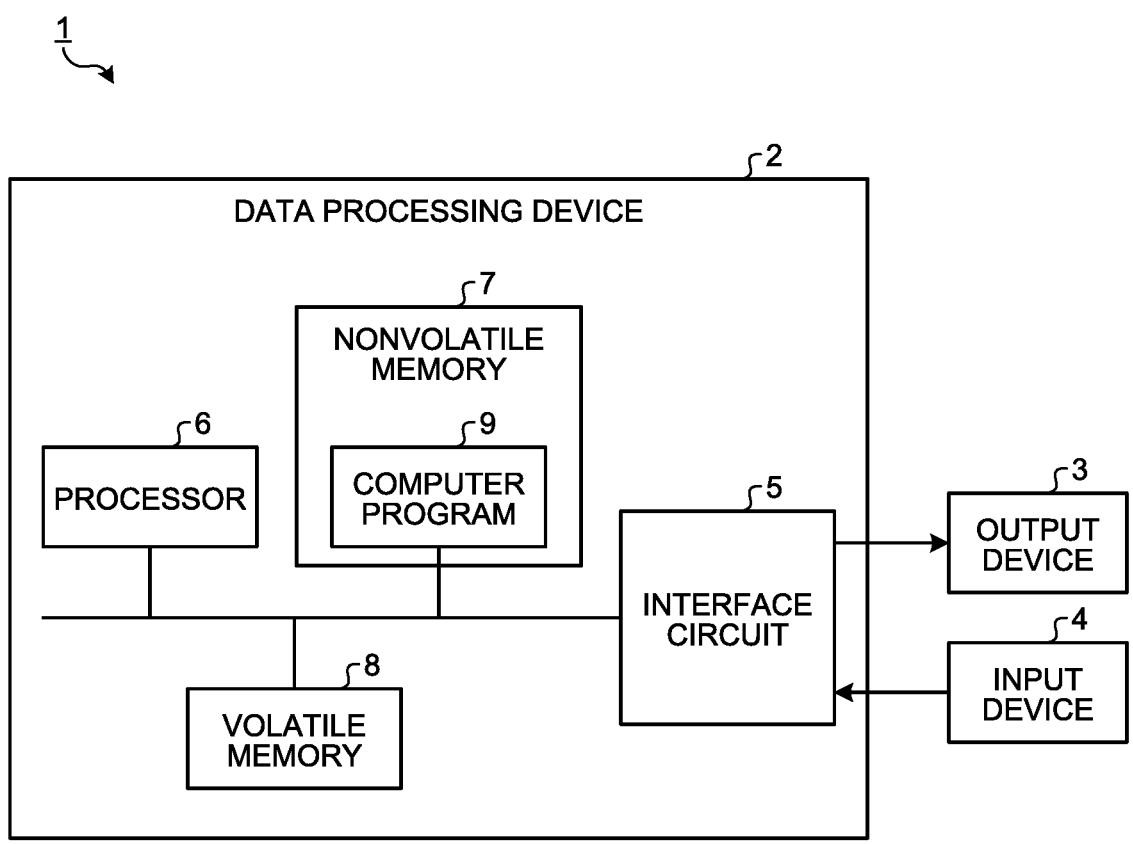
FIG. 1 is a hardware configuration diagram illustrating an exemplary simulation system according to a first embodiment.

A first embodiment will be described. FIG. 1 is a hardware configuration diagram illustrating an exemplary simulation system 1 according to the present embodiment. As illustrated in FIG. 1, the simulation system 1 includes: a data processing device 2; an output device 3 that outputs output data supplied from the data processing device 2; and an input device 4 that generates input data. The output device 3 and the input device 4 are connected to an interface circuit 5 of the data processing device 2.

The data processing device 2 includes: an interface circuit 5; a processor 6 like a central processing unit (CPU); a nonvolatile memory 7 like a read only memory (ROM) or a flash memory; and a volatile memory 8 like a random access memory (RAM). The nonvolatile memory 7 stores a computer program 9 executed in data processing in the data processing device 2. The computer program 9 is loaded from the nonvolatile memory 7 onto a working area of the volatile memory 8, and executed by being read by the processor 6.

The output device 3 includes a display device to display the display data supplied from the data processing device 2. The output device 3 includes a flat panel display such as a liquid crystal display (LCD) or an organic electroluminescence display (OELD).

The input device 4 generates input data by being operated by a user. The input data generated at the input device 4 is output to the data processing device 2. The input device 4 includes a touch sensor provided on a display screen of the display device 3. Note that the input device 4 may include at least one of a computer keyboard and a mouse.

Figure 2:
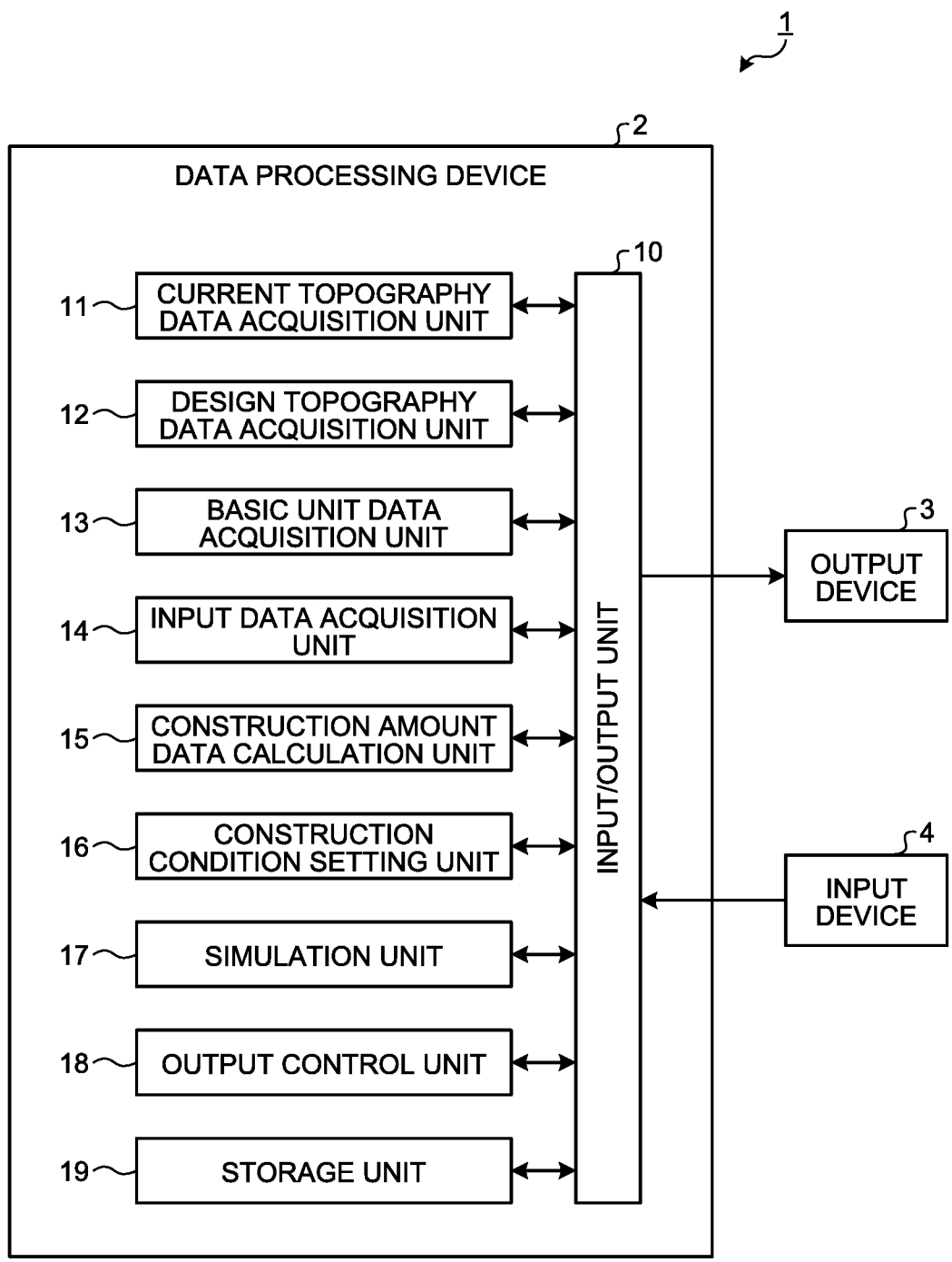
FIG. 2 is a functional block diagram illustrating an exemplary simulation system according to the first embodiment.

FIG. 2 is a functional block diagram illustrating an exemplary simulation system 1 according to the present embodiment. As illustrated in FIG. 2, the simulation system 1 includes: an input/output unit 10, a current topography data acquisition unit 11 that acquires current topography data indicating a current topography of a construction site; a design topography data acquisition unit 12 that acquires design topography data indicating a design topography of the construction site; a basic unit data acquisition unit 13 that acquires basic unit data indicating specifications of resources related to construction in the construction site; and an input data acquisition unit 14 that acquires input data generated by the input device 4 being operated.

Additionally, the simulation system 1 further includes: a construction amount data calculation unit 15 that calculates construction amount data indicating a construction amount in a construction site on the basis of a current topography and a design topography; a construction condition setting unit 16 that sets construction condition data indicating construction procedures; a simulation unit 17 that calculates a transition state of the construction site on the basis of the basic unit data, construction condition data, and construction amount data; an output control unit 18 that outputs calculated data of the simulation unit 17 to the output device 3; and a storage unit 19 that stores data.

A function of the input/output unit 10 is exerted by the interface circuit 5. The respective functions in the current topography data acquisition unit 11, design topography data acquisition unit 12, basic unit data acquisition unit 13, input data acquisition unit 14, construction amount data calculation unit 15, construction condition setting unit 16, simulation unit 17, and output control unit 18 are exerted by the processor 6. The function of the storage unit 19 is exerted by the nonvolatile memory 7 or the volatile memory 8.

The current topography data acquisition unit 11 acquires current topography data indicating a current topography of a construction site. The current topography data is three-dimensional topography data. The current topography data includes positional data of a plurality of points. Positional data of each point is three-dimensional coordinate data including latitude data, longitude data, and altitude data. Current topography data is acquired by a camera mounted on an unmanned air vehicle such as an unmanned airplane or an unmanned helicopter. In the present embodiment, the description will be provided assuming that a drone is used as the unmanned air vehicle. The drone takes an aerial photograph of a construction site and acquires current topography data. The current topography data acquisition unit 11 acquires the current topography data from the drone. In the present embodiment, the input/output unit 10 has a radio communication function. The current topographical data acquired by the drone is supplied to the input/output unit 10 by radio communication, for example. The current topography data acquisition unit 11 acquires the current topography data supplied via the radio communication. Note that the current topography data may also be acquired by a stereo camera mounted on a work machine in the construction site. Additionally, the current topography data may be data generated by using three-dimensional computer aided design (CAD) or may be data generated by a predetermined institution such as the Geographical Survey Institute.

The design topography data acquisition unit 12 acquires design topography data indicating a design topography of a construction site. The design topography data is three-dimensional topography data. The design topography data includes positional data of a plurality of points. Positional data of each point is three-dimensional coordinate data including latitude data, longitude data, and altitude data. The design topography data is created by, for example, a construction company. The design topography data acquisition unit 12 acquires design topography data from the construction company. In the present embodiment, the input/output unit 10 is connected to, for example, the Internet. The design topography data created by the construction company is supplied from an information terminal of the construction company to the input/output unit 10 via the Internet. The design topography data acquisition unit 12 acquires the design topography data supplied via the Internet.

The basic unit data acquisition unit 13 acquires basic unit data indicating specifications of resources related to construction in a construction site. The basic unit data is stored in the storage unit 19. The basic unit data includes data indicating construction capacity of a work machine that constructs the construction site. The basic unit data includes the construction capacity of each of a plurality of work machines that can be used for construction in the construction site. The basic unit data of each of the plurality of work machines is compiled into a database and stored in the storage unit 19. The basic unit data acquisition unit 13 acquires the basic unit data from the storage unit 19. Meanwhile, the basic unit data of each of the plurality of work machines may also be stored in a database device different from the data processing device 2. The basic unit data may be supplied from this database device to the input/output unit 10. The basic unit data acquisition unit 13 may acquire the basic unit data from this database device.

A work machine is a work vehicle that can be operated in a construction site. The work machine includes at least one of: a construction machine capable of dozing or excavating earth and sand; and a haulage vehicle capable of hauling earth and sand. The construction machine includes at least one of: an excavator having a bucket; and a bulldozer having a blade. The haulage vehicle includes a dump truck having a vessel. Note that the construction machine may also be a wheel loader or a motor grader.

Furthermore, construction capacity of a work machine in the basic unit data includes a work amount that can be performed by the work machine per unit time. The work amount that can be performed by the work machine per unit time is an index indicating work capacity of the work machine and corresponds to an amount of earth and sand that can be moved by the work machine per unit time. In a case where the work machine is a bulldozer, a work amount of the bulldozer includes at least one of a dozing amount and an embankment amount which can be performed by the bulldozer per unit time. In a case where a work machine is an excavator, a work amount of the excavator includes at least one of a loading amount, a cut amount, and an embankment amount which can be performed by the excavator per unit time. In a case where the work machine is a dump truck, a work amount of the dump truck indicates an amount of earth and sand that can be hauled by the dump truck per unit time. Note that the dozing amount represents an amount of earth and sand that can be dozed by a construction machine. The embankment amount represents an amount of earth and sand that can be banked by a construction machine. The loading amount represents an amount of earth and sand that can be loaded on a haulage vehicle by a construction machine. The cut amount represents an amount of earth and sand that can be excavated by a construction machine.

In a case where a work machine is an excavator, a work amount of the work machine that can be performed per unit time includes a bucket capacity indicating a size of a bucket of the excavator. The work amount of the excavator is dependent on the bucket capacity. In a case where the bucket capacity is large, the work amount will be increased. In a case where the bucket capacity is small, the work amount is reduced.

In a case where a work machine is a bulldozer, a work amount of the work machine that can be performed per unit time includes a blade size of the bulldozer. The work amount of the bulldozer is dependent on the blade size. In a case where the blade size is large, the work amount is increased. In a case where the blade size is small, the work amount is reduced.

Additionally, in a case where a work machine is an excavator, basic unit data includes not only a bucket capacity but also a maximum excavation height, a maximum swing radius, and slope face shaping capacity of the excavator. Also, in a case where the excavator is rented for use, the basic unit data includes a daily rental fee or a monthly rental fee. Additionally, the basic unit data includes fuel consumption of the work machine.

Furthermore, the basic unit data includes at least one of a type, a model, a vehicle class of a work machine, and the number of work machines that can be procured in a construction site. Additionally, the basic unit data includes a management state of the work machine.

Furthermore, the basic unit data further includes construction capacity by a worker in a construction site, that is, an operator who operates the work machine. The construction capacity of a worker includes proficiency or skill of the worker. Also, the basic unit data includes the number of workers who can be procured in a construction site.

Additionally, the basic unit data includes construction work capacity for a structure. The construction work for a structure includes installation work for concrete blocks, concrete panels, and the like and ground leveling work in bank protecting construction, slope face construction, and the like. Furthermore, the basic unit data includes survey ability by a worker.

Furthermore, the basic unit data may include data that indexes ease of work in a construction site. Additionally, in a case where construction contents is not excavation or dozing of earth and sand but construction of a structure such as building of a concrete structure, installation of a retaining wall, or the like (construction site), the basic unit data may include ease of construction, and construction capacity of a worker with respect to construction of the structure.

In other words, the basic unit data is the data indicating: resources required for construction such as a work machine and a worker; ease of construction with respect to construction contents; and the like. The data includes capacity of a work machine, skill of a worker, specification of a structure to be installed, and a soil property of a construction site. In other words, the basic unit data is data indicating specifications of related resources in order to perform construction in a construction site. The basic unit data is known data that can be acquired prior to construction, and is compiled into a database and held in the storage unit 19.

The input data acquisition unit 14 acquires input data input by a user from the input device 4.

The construction amount data calculation unit 15 compares and checks current topography data acquired by the current topography data acquisition unit 11 and design topography data acquired by the design topography data acquisition unit 12, and calculates construction amount data indicating a construction amount in a construction site. The construction amount data calculation unit 15 calculates the construction amount data from a difference between a current topography and a design topography.

The construction amount data includes at least one of: construction range data indicating a construction range in a construction site; cut data of earth and sand; and embankment data of earth and sand. The cut data includes at least one of: cut region data indicating a region where cutting of earth and sand is required in a construction range; and cut amount data indicating a cut amount of earth and sand in the construction range. The embankment data includes at least one of: embankment region data indicating a region where embankment of earth and sand is required in the construction range; and embankment amount data indicating an embankment amount of earth and sand in the construction range. Cut soil represents earth and sand excavated by a work machine or a worker. The cut amount represents an excavation amount of earth and sand. Embankment soil represents banked earth and sand. The embankment amount represents a banked amount of earth and sand.

The construction amount data calculation unit 15 calculates, from a difference between a current topography and a design topography, a cut region and a cut amount from the current topography. Additionally, the construction amount data calculation unit 15 calculates, from a difference between the current topography and a designed topography, an embankment region and an embankment amount on a current topography.

The construction condition setting unit 16 acquires construction condition data indicating a construction condition of a construction site. The construction condition data includes construction procedures. Additionally, the construction condition data includes at least one of: a soil property of a construction site; and a travel route of a work machine.

In the present embodiment, the construction condition data includes input data generated in the input device 4. In other words, in the present embodiment, a user operates the input device 4 to input the construction condition data. The input data indicating the construction condition data generated at the input device 4 is acquired by the input data acquisition unit 14. The construction condition setting unit 16 acquires the construction condition data from the input data acquisition unit 14. The construction condition setting unit 16 sets construction condition data on the basis of the input data input by a user.

The simulation unit 17 calculates a transition state of a construction site on the basis of basic unit data acquired by the basic unit data acquisition unit 13, construction condition data set by the construction condition setting unit 16, and construction amount data calculated by the construction amount data calculation unit 15. The transition state of a construction site includes one or both of a site state of a construction site and an operation state of a work machine. The site state of a construction site includes one or both of a topography state of the construction site and an installation state of a structure in the construction site. The simulation unit 17 simulates, on the basis of the basic unit data, construction condition data, and construction amount data, a topography of a construction site that is changed in accordance with construction progress. Additionally, the simulation unit 17 simulates an operation state of a work machine including, for example, an operation rate on the basis of the basic unit data, construction condition data, and construction amount data.

Furthermore, the simulation unit 17 calculates construction efficiency at the time of performing construction for a calculated construction amount on the basis of basic unit data acquired by the basic unit data acquisition unit 13, construction condition data set by the construction condition setting unit 16, and construction amount data calculated by the construction amount data calculation unit 15. The construction efficiency includes at least one of cost, man-hours, and a construction term required for construction. The simulation unit 17 simulates at least one of the cost, man hours, and construction term required for construction on the basis of the basic unit data, construction condition data, and construction amount data.

The output control unit 18 outputs calculation data of the simulation unit 17 to the output device 3. The calculation data of the simulation unit 17 includes a simulation result of the simulation unit 17. In the present embodiment, the calculation data of the simulation unit 17 includes transition state data indicating a transition state of a construction site and construction efficiency data indicating construction efficiency. The output control unit 18 controls the output device 3. The output control unit 18 generates, from the calculation data of the simulation unit 17, output data (display data) to be displayed on the output device 3, and causes the output device 3 to display the same. Consequently, the simulation result calculated by the simulation unit 17 is visualized.

Figure 3:
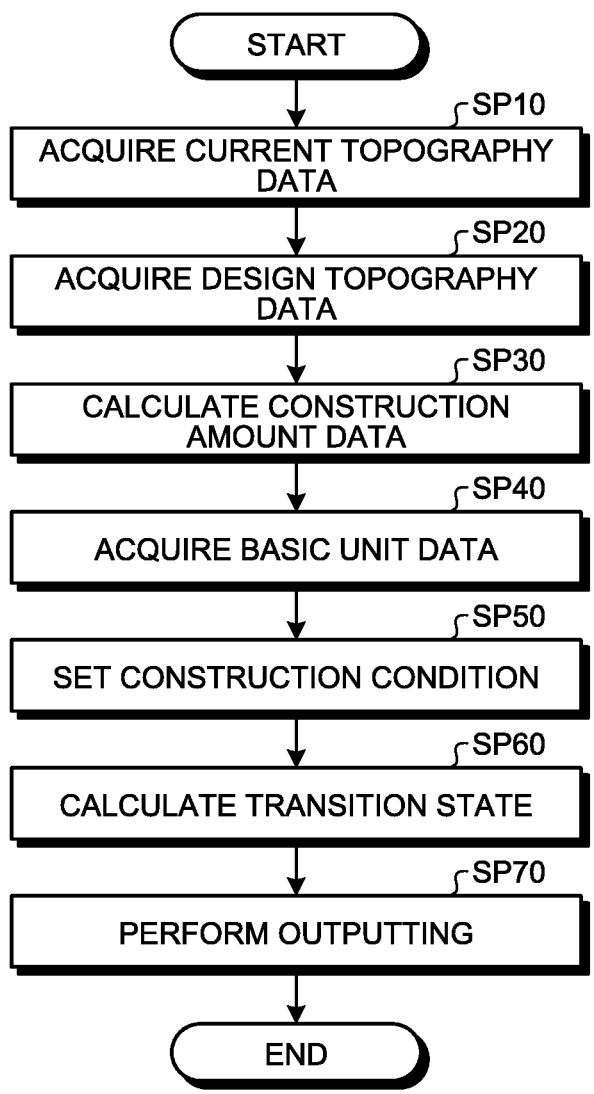
FIG. 3 is a flowchart illustrating an exemplary simulation method according to the first embodiment.

Next, a simulation method according to the present embodiment will be described. FIG. 3 is a flowchart illustrating an exemplary simulation method according to the present embodiment. As illustrated in FIG. 3, the simulation method according to the present embodiment includes: acquiring current topography data indicating a current topography of a construction site (step SP10); acquiring design topography data indicating a design topography of the construction site (step SP20); calculating construction amount data indicating a construction amount of the construction site on the basis of the current topography and the design topography (step SP30); acquiring basic unit data indicating specifications of related resources in order to perform construction in a construction site, such as construction capacity of a work machine used to construct the construction site (step SP40); setting a construction condition including construction procedures (step SP50); calculating a transition state of the construction site on the basis of the construction condition data indicating a construction condition, the basic unit data, and the construction amount data (step SP60); and outputting the calculated transition state to the output device 3 (step SP70).

The current topography data is acquired (step SP10). In the present embodiment, a drone equipped with a camera flies above a construction site, and acquires current topography data by photographing the construction site with the camera. The current topography data is transmitted from the drone to the current topography data acquisition unit 11. The current topography data acquisition unit 11 acquires the current topography data from the drone.

Next, the design topography data is acquired (step SP20). The design topography data indicates a target topography of the construction site after construction. The design topography data acquisition unit 12 acquires the design topography data from an information terminal of a construction company.

Next, the construction amount data is calculated (step SP30). The construction amount data calculation unit 15 calculates a cut region and a cut amount and an embankment region and an embankment amount from a difference between the current topography and the design topography. As described above, each of the current topography data and the design topography data includes positional data of a plurality of points (three-dimensional coordinate data). For example, the construction amount data calculation unit 15 calculates a difference between positional data of a first point of the current topography data and positional data of the first point of the design topography data, and calculates a construction amount in the first point. The construction amount data calculation unit 15 calculates a difference between positional data of the current topography data and positional data of the design topography data for each of the plurality of points in the construction site, and calculates a construction amount in each of the plurality of points. Consequently, the construction amount data calculation unit 15 can calculate a cut region and a cut amount as well as an embankment region and an embankment amount in the entire construction site.

Figure 4:
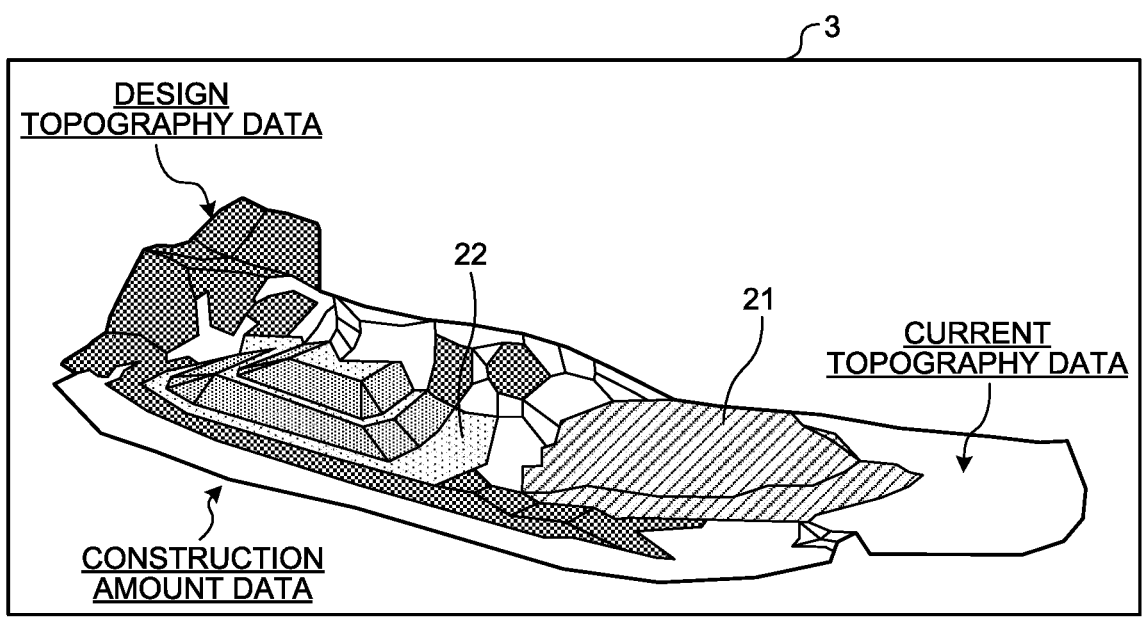
FIG. 4 is a diagram schematically illustrating exemplary construction amount data displayed on an output device according to the first embodiment.

The output control unit 18 causes the output device 3 to display the construction amount data calculated by the construction amount data calculation unit 15. FIG. 4 is a diagram schematically illustrating an exemplary construction amount data displayed on the output device 3 according to the present embodiment. As illustrated in FIG. 4, the output control unit 18 causes the output device 3 to display current topography data and design topography data in a superimposed manner. The output control unit 18 causes the output device 3 to display, as construction amount data, a cut region 21 indicating a range to be cut and an embankment region 22 indicating a range to be banked. The output control unit 18 causes the output device 3 to three-dimensionally display current topography data, design topography data, and construction amount data.

Next, basic unit data is acquired (step SP40). The basic unit data indicating construction capacity of each of a plurality of work machines that can be used for construction in the construction site is compiled into a database, and stored in the storage unit 19. A user operates the input device 4 to select, from the basic unit data compiled into the database, a work machine to be used for construction in the construction site. The user operates the input device 4 to designate a type and the number of the work machines to be used.

Additionally, a user operates the input device 4 to select a worker to be procured for construction in the construction site from the basic unit data compiled into the database. A worker is, for example, an operator who can operate a work machine. Also, a user is, for example, a supervisor or a manager in a construction site. The user operates the input device 4 to designate a worker and the number of workers to be procured.

Figure 5:
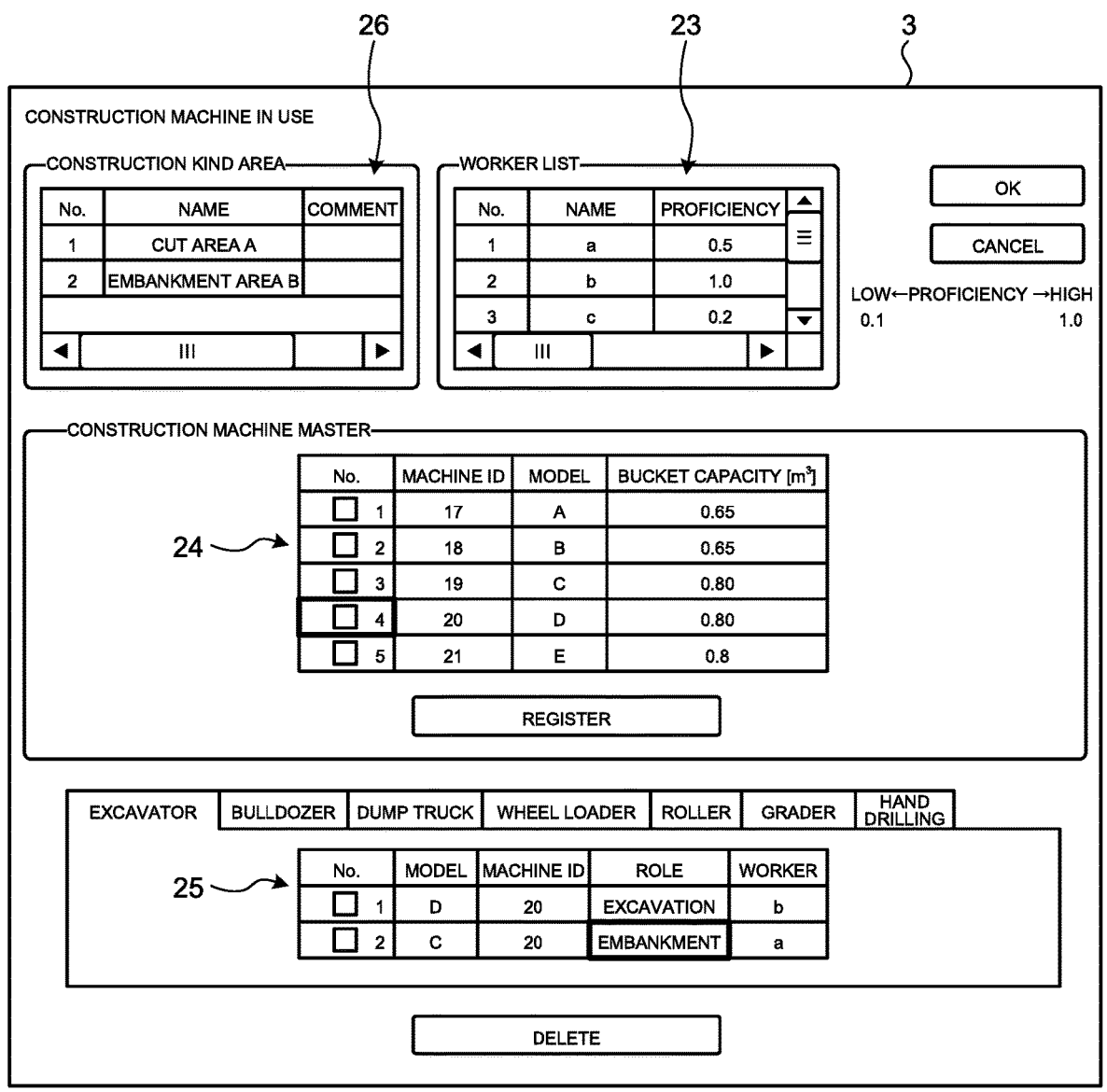
FIG. 5 is a diagram schematically illustrating exemplary basic unit data displayed on the output device according to the first embodiment.

FIG. 5 is a diagram schematically illustrating exemplary basic unit data displayed on the output device 3 according to the present embodiment. As illustrated in FIG. 5, the output control unit 18 causes the output device 3 to display a worker list 23 compiled into a database and a work machine list 24 compiled into a database. As illustrated in the worker list 23, the basic unit data of workers includes proficiency of each worker. As the proficiency of each worker, it may be possible to use a value obtained by multiplying an index indicating proficiency by a coefficient considering a topography of a construction site and skill corresponding to each construction content. As illustrated in the work machine list 24, the basic unit data of the work machines includes: a "model number" indicating a type of a work machine; and information needed for calculating a work amount that can be performed by the work machine per unit time, such as a "bucket capacity" and the like. A user selects a work machine to be used from the work machine list 24 via the input device 4, and also selects a worker to be procured from the worker list 23. The selected work machine and worker are displayed in a work content list 25.

Next, a construction condition is set (step SP50). A user operates the input device 4 to input construction condition data. In the present embodiment, the construction condition data includes construction procedures.

As illustrated in FIG. 5, the output control unit 18 causes the output device 3 to display the work content list 25 indicating work contents required for construction. Furthermore, the output control unit 18 causes the output device 3 to display a construction kind area list 26 in order to designate a part of the cut region 21 and a part of the embankment region 22 in the construction site. A construction kind area indicated in the construction kind area list 26 is an area obtained by partitioning the construction site, and represents an area in which a work content to be performed in this area is designated. A user allocates a work machine and a worker to perform construction in a construction kind area displayed in the construction kind area list 26. In the example illustrated in FIG. 5, as illustrated in the work content list 25, the user allocates a work machine of a model number "D" and a worker b (Item No. 1 in the work content list 25) to cut work in a construction kind area in a part of the cut region 21 named as a "cut area A". Additionally, the user allocates a work machine of a model number "C" and a worker a (Item No. 2 in the work content list 25) to embankment work in a construction kind area in a part of the embankment region 22 named as an "embankment area B". Furthermore, as illustrated in the work content list 25, the user allocates "excavation" work to the work machine D and the worker b, and allocates "embankment" work to the work machine C and the worker a. The embankment work includes work such as ground leveling and slope face shaping. Additionally, in the example illustrated in FIG. 5, as illustrated in the work content list 25, the user designates construction procedures (order) such that embankment work in the embankment area B is performed after cut work in the cut area A.

Meanwhile, to simplify the description, the example illustrated in FIG. 5 describes the example in which the two construction kind areas (cut area A and embankment area B) are displayed in the construction kind area list 26, and a work machine and a worker are allocated to construction in each of the two construction kind areas, and the two construction procedures are designated. Actually, for example, each of the cut region 21 and the embankment region 22 is partitioned into at least two or more construction kind areas, and work machines and workers are allocated to the plurality of construction kind areas. A construction kind area may be set for a same place inside a construction site, or a construction kind area may be set for different places inside the construction site. Additionally, the construction procedures (order) for the plurality of construction kind area is designated by a user. Furthermore, the work contents include not only cut work and embankment work but also work to form a slope, work to perform leveling, work to make a retaining wall or make a wall for bank protection by installing a structure such as concrete by using a construction machine, and work to haul earth and sand by using a haulage vehicle.

Furthermore, in the present embodiment, a user can designate a construction kind area in three-dimensional display data described with reference to, for example, FIG. 4 by using the input device 4 such as a mouse or a touch panel.

Figure 6:
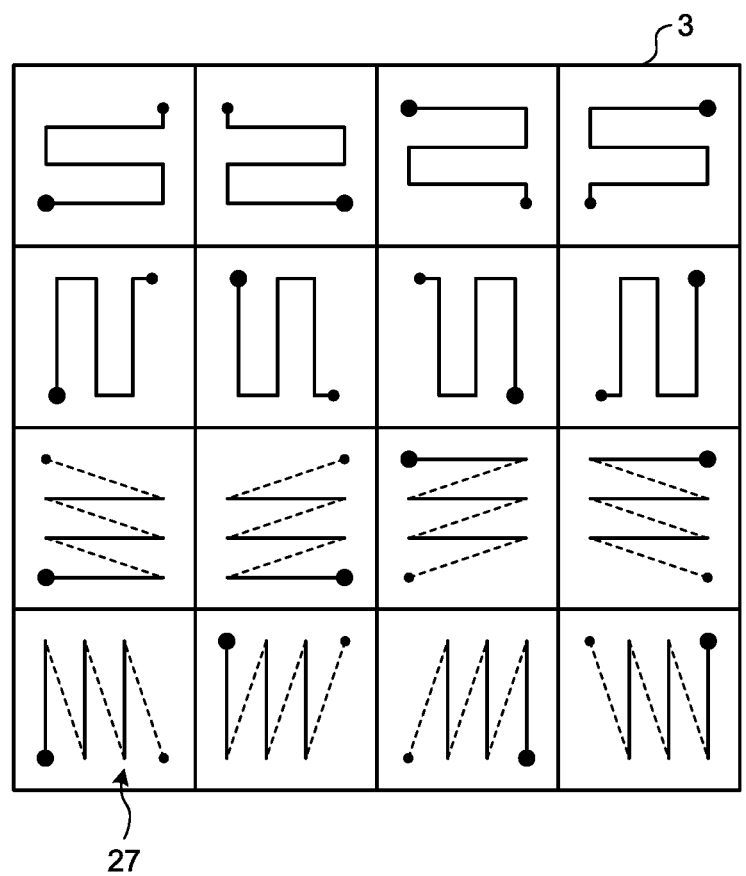
FIG. 6 is a diagram schematically illustrating exemplary construction condition data displayed on the output device according to the first embodiment.

Additionally, a user can designate procedures to move a work machine in one construction kind area. FIG. 6 is a diagram schematically illustrating exemplary construction condition data displayed on the output device 3 according to the present embodiment. As illustrated in FIG. 6, the output control unit 18 causes the output device 3 to display a plurality of moving track patterns 27. A moving track pattern 27 indicates, for example, a track in which an excavator or a bulldozer is moved in one construction kind area. A moving track pattern 27 is prepared in accordance with a type of a work machine to be used. A user can operate the input device 4 to select an arbitrary moving track pattern 27 from the plurality of moving track patterns 27 displayed on the output device 3.

Additionally, a user sets a soil property of a construction site as construction condition data. FIG. 7 is a diagram schematically illustrating exemplary construction condition data displayed on the output device 3 according to present embodiment. As illustrated in FIG. 7, the output control unit 18 causes the output device 3 to display a soil property list 28 indicating a plurality of soil properties. In the example illustrated in FIG. 7, "sand", "viscous soil", "gravel mixed soil", and "rock lump/cobbled stone" are displayed as the soil property list 28. The user operates the input device 4 to select, from the soil property list 28, a soil property closest to a soil property in a construction site.

Furthermore, the soil property list 28 includes standard soil swell/shrinkage factors of concerned earth and sand. In the soil property list 28, a standard soil swell factor L represents a rate at which a volume of earth and sand is increased by containing air at the time of loading excavated earth and sand on a dump truck or the like. A standard soil shrinkage factor C represents a rate at which a volume of the earth and sand is reduced at the time of compaction thereof.

Furthermore, when simulation is performed, current topography data, design topography data, and construction amount data are mesh-divided. As illustrated in FIG. 7, the output control unit 18 causes the output device 3 to display a division width designation field 29 for a user to designate a division width for mesh division. The user designates the division width for mesh division via the input device 4. In FIG. 7, a division width in a latitude direction and a longitude direction for mesh division is input in an input field indicated as "XY direction", and a division width in an altitude direction for mesh division is input in an input field indicated by "Z direction".

Furthermore, in the present embodiment, a travel route of a haulage vehicle is set as construction condition data. FIG.

8 is a diagram schematically illustrating exemplary construction condition data displayed on the output device 3 according to the present embodiment. A user operates the input device 4 to designate a travel condition of a haulage vehicle in a construction site. The travel condition of the haulage vehicle includes: a travel start point P1 where the haulage vehicle is desired to start traveling; and a travel finish point P2 where the haulage vehicle is desired to finish traveling. The user operates the input device 4 to designate the travel start point P1 and the travel finish point P2. A plurality of travel roads may be set in a construction site.

Additionally, the output control unit 18 causes the display device 3 to display: a travel designation field 30 to make a user designate whether haulage vehicles can pass each other; a standby place designation field 31 to make a user designate whether there is any place where a haulage vehicle can stand by; a road surface input field 32 to make a user input a road surface state; and a stock soil amount designation field 40 to designate a maximum stock amount at the time of accumulating earth and sand that have been cut or a maximum stock amount at the time of accumulating earth and sand for embankment. A user determines, from a state of a construction site, whether haulage vehicles can pass each other, and operates the input device 4 to designate whether the haulage vehicles can pass each other. Additionally, whether haulage vehicles can pass each other may be set for all of travel roads, and whether haulage vehicles can pass each other may be set for some of the travel roads. For example, it may be possible to set whether vehicles can pass each other after selecting a travel road on a map illustrated in FIG. 8. Furthermore, it may also be possible to set whether vehicles can pass each other in a certain interval after selecting the certain interval of the travel road illustrated in FIG. 8. Additionally, a user determines, from a state of the construction site, whether there is any place where a haulage vehicle can stand by, and operates the input device 4 to designate whether there is any place where a haulage vehicle can stand by. Also, a user determines a road surface state from a state of the construction site, and operates the input device 4 to input the road surface state. A cut maximum amount to be loaded, which is designated by the stock soil amount designation field 40, is a maximum stock amount when an excavator performs cut work and accumulates earth and sand in order to load the same on a haulage vehicle, for example, and a simulation result (operation rate of the excavator or operation rate of the haulage vehicle) is varied by this soil amount. Additionally, an embankment maximum amount to be graded, which is designated by the stock soil amount designation field 40, is a maximum stock amount at the time of, for example, accumulating earth and sand brought by a haulage vehicle in order to perform embankment work by a bulldozer, and a simulation result (operation rate of the bulldozer and operation rate of the haulage vehicle) is varied by this soil amount.

The construction condition setting unit 16 determines a travel route 33 of a dump truck 2 on the basis of input data generated by operating the input device 4. The construction condition setting unit 16 calculates the travel route 33 such that a haulage vehicle does not travel along a route having 10 [%] or more of a sloping road surface and also such that a distance from the travel start point P1 to a travel start point P2 becomes the shortest. Furthermore, the construction condition setting unit 16 calculates an optimal travel route 33 on the basis of designation data designated in the travel designation field 30, designation data designated in the standby place designation field 31, and designation data input in the road surface input field 32. Additionally, the construction condition setting unit 16 calculates a travel route 33 considering presence of an obstacle in a construction site. Note that a user may also designate an arbitrary travel route 33 by using the input device 4.

Additionally, a construction period (construction term) is set as the construction condition data. The construction period represents, for example, a period from a date starting construction until a date completing the construction, and a user operates the input device 4 to input a construction start time point and a construction completion time point.

After the construction conditions which are preconditions in simulation are set, simulation of the construction is executed (step SP60). The simulation unit 17 calculates a transition state of a construction site on the basis of basic unit data, construction condition data, and construction amount data. Additionally, the simulation unit 17 calculates construction efficiency in performing construction of a construction amount calculated by the construction amount data calculation unit 15 on the basis of the basic unit data, construction condition data, and construction amount data.

The transition state of a construction site includes one or both of a site state of a construction site and an operation state of a work machine. The construction efficiency includes at least one of cost, man-hours, and a construction term required for construction.

The calculated data obtained by the simulation unit 17 is output to the output device 3 (step SP70). The output control unit 18 generates, from the calculation data of the simulation unit 17, display data (simulation result) that can be displayed on the output device 3, and outputs the same to the output device 3.

Figure 9:
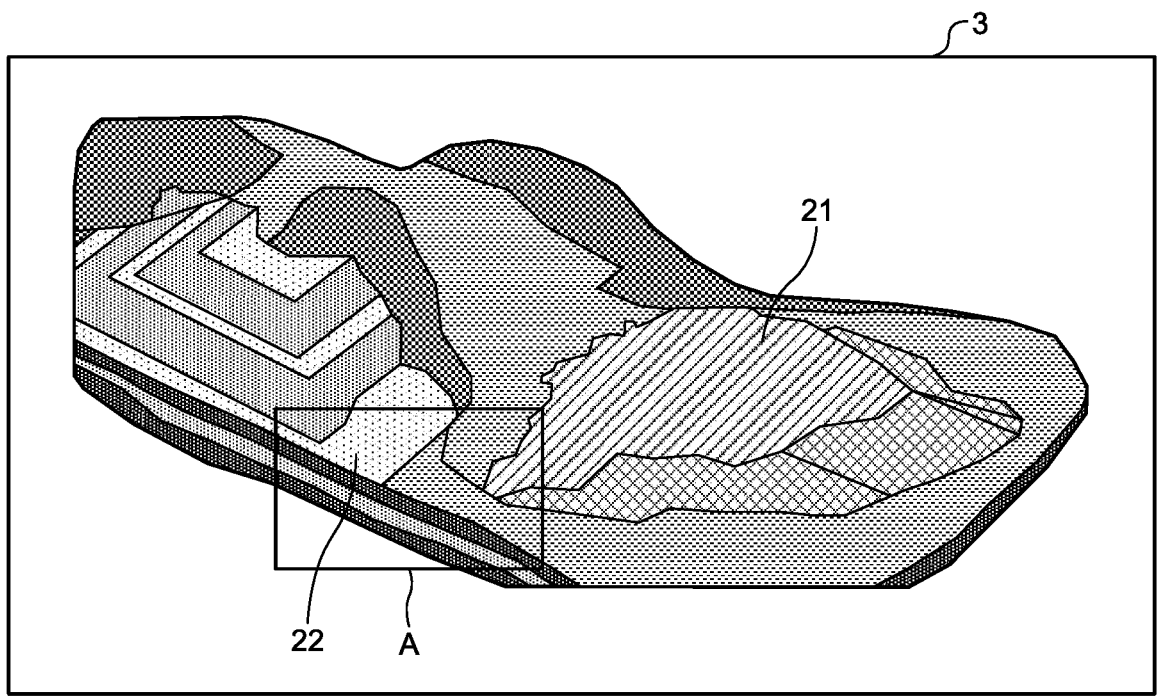
FIG. 9 is a diagram schematically illustrating an exemplary simulation result displayed on the output device according to the first embodiment.
Figure 10:
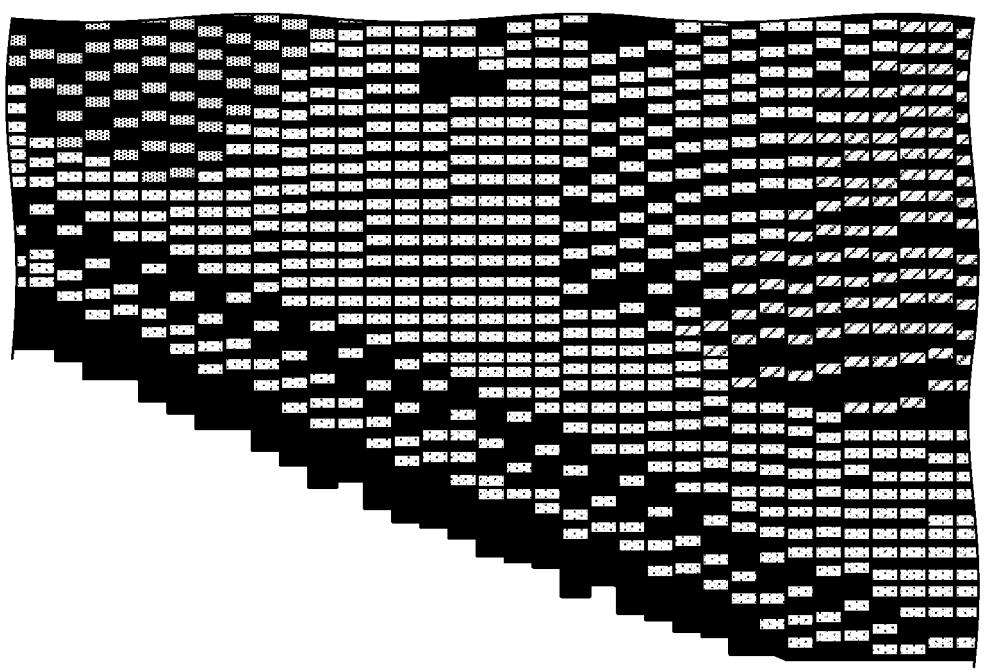
FIG. 10 is a diagram schematically illustrating an exemplary simulation result displayed on the output device according to the first embodiment.

FIGS. 9 and 10 are diagrams schematically illustrating exemplary simulation results displayed on the output device 3 according to present embodiment. FIG. 10 is an enlarged view of a portion A in FIG. 9.

The simulation unit 17 simulates, on the basis of the basic unit data, construction condition data, and construction amount data, a topography of a construction site that is changed in accordance with construction progress. The simulation unit 17 simulates, every predetermined period (for example, every one second), a topography of the construction site in each time point during a construction period input as the construction condition data. The output control unit 18 causes the output device 3 to display a topography of the construction site calculated every predetermined period in a manner correlated to an elapsed time from a construction start time point. In other words, the output control unit 18 causes the output device 3 to display moving image data of the topography of the construction site that is changed in accordance with progress of construction.

As illustrated in FIG. 10, the output control unit 18 causes the output device 3 to display a topography of a construction site by using meshes partitioned in accordance with mesh division designated by a user in FIG. 7, namely, a plurality of blocks (meshes). The output control unit 18 changes a position and the number of the blocks in accordance with movement of earth and sand in a manner correlated to an elapsed time from the construction start time point, and visualizes change in the topography of the construction site.

Figure 11:
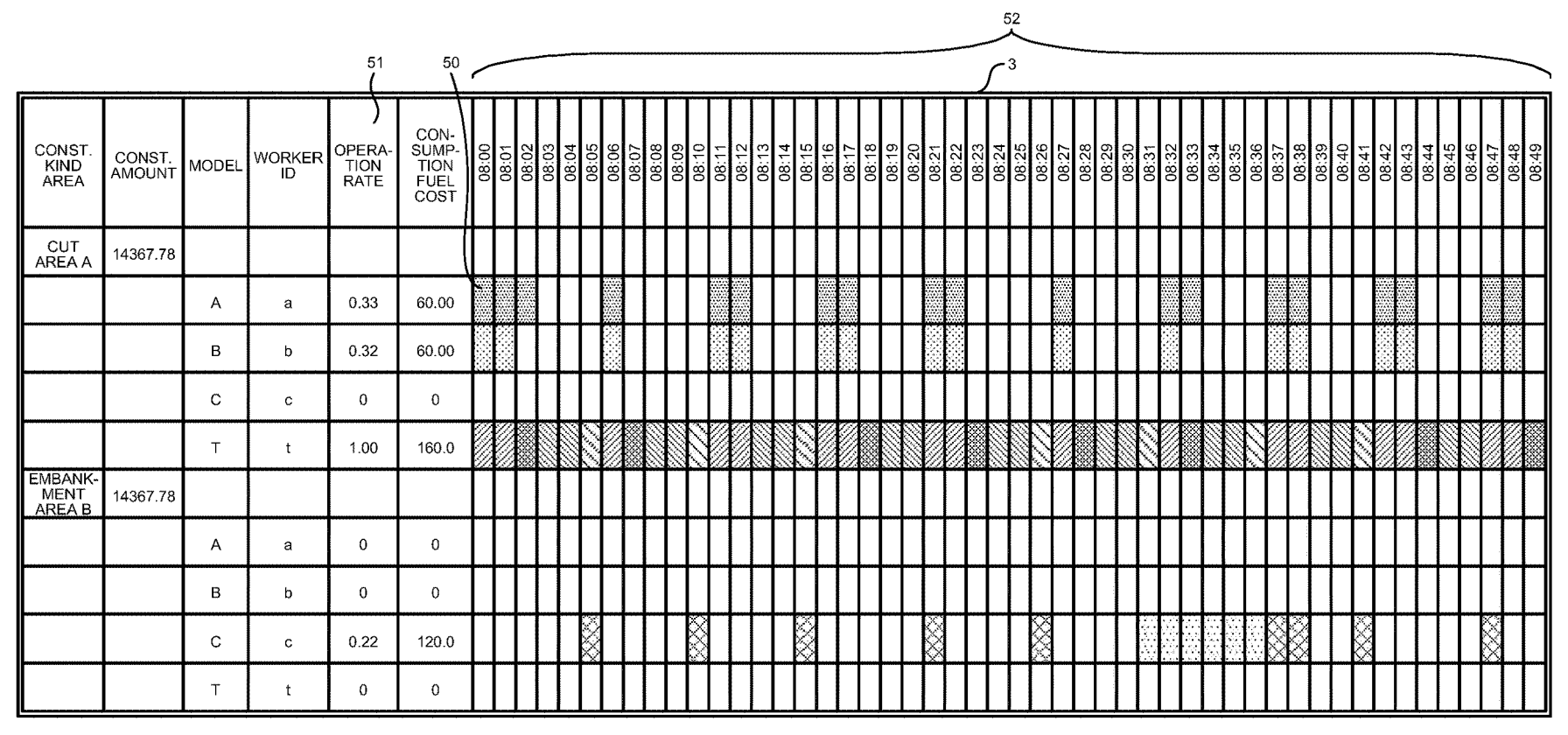

FIG. 11 is a diagram schematically illustrating an exemplary simulation result displayed on the output device 3 according to the present embodiment. The simulation unit 17 simulates an operation state of a work machine every predetermined period (for example, every one second) during a construction period 52 input as construction condition data. The operation state of the work machine includes an operation rate of the work machine. The output control unit 18 causes the output device 3 to display an operation state of the work machine calculated every predetermined period in a manner correlated to an elapsed time from a construction start time point. As illustrated in FIG. 11, the output control unit 18 causes the output device 3 to display a table indicating the operation state of the work machine calculated every predetermined period.

In a case where a work machine is being operated, a cell 50 in the table indicating the work machine is colored as illustrated in FIG. 11. The simulation unit 17 simulates whether the work machine is being operated every one second, for example. The output control unit 18 causes the output device 3 to display, by color coding, whether the work machine is being operated every one second, for example.

Additionally, the simulation unit 17 calculates an operation rate 51 of a work machine per hour, for example. As illustrated in FIG. 11, the output control unit 18 causes the output device 3 to display a calculated value of the operation rate. In a case where the operation rate 51 is high, the number of colored cells 50 indicating the work machine is increased, and in a case where the operation rate 51 is low, the number of colored cells 50 indicating the work machine is reduced.

Figure 12:
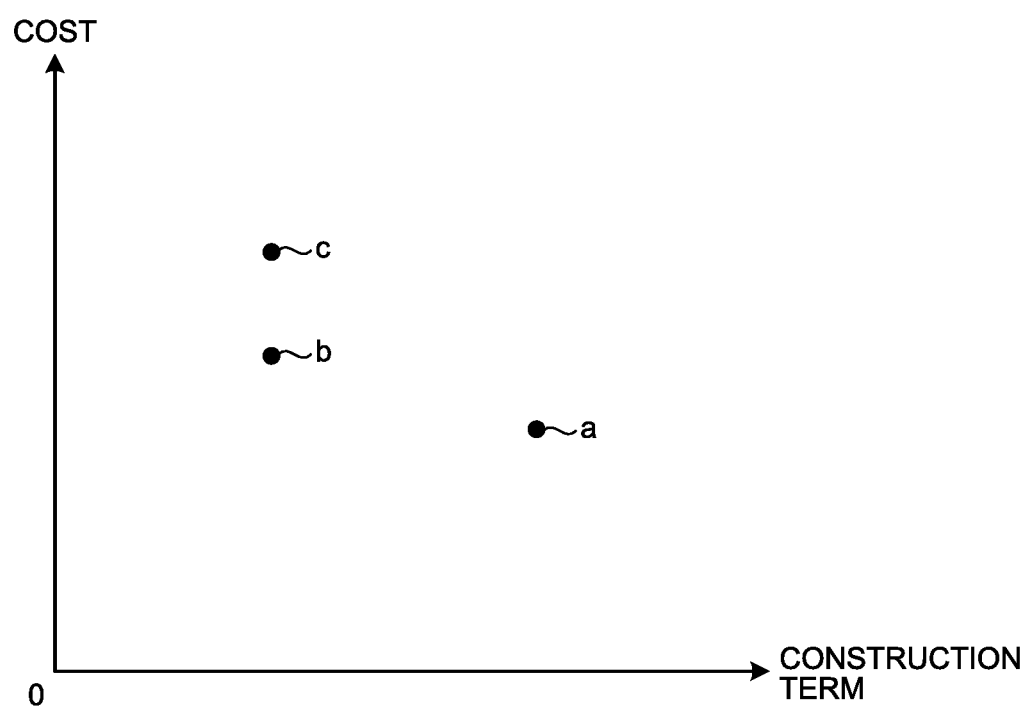
FIG. 12 is a diagram illustrating an exemplary simulation result by a simulation unit according to the present embodiment.

FIG. 12 is a diagram illustrating an exemplary simulation result by the simulation unit 17 according to present embodiment. The simulation unit 17 simulates, as a simulation result, a relation between a cost required for construction and a construction term. In FIG. 12, a horizontal axis represents the construction term, and a vertical axis represents the cost required for construction.

In FIG. 12, each of points a, b, and c represents a simulation result calculated on the basis of a different construction condition or different basic unit data. Each of the points a, b, and c is a point to plot the relation between the cost calculated by the simulation unit 17 and the construction term. The simulation unit 17 can perform simulation a plurality of times while changing a construction condition or a basic unit. For example, in a case where simulation is performed by changing the number of dump trucks, different simulation results can be obtained as illustrated in FIG. 12. For example, the point a represents a simulation result in a case of using six dump trucks as the basic unit data, the point b represents a simulation result in a case of using seven dump trucks as the basic unit data, the point c represents a simulation result in a case of using eight dump trucks as the basic unit data. In the case of the result represented by the point a, the cost is lower than other results but the construction term is longer than others. In the case of the result represented by the point b, the cost is high because the number of dump trucks is increased by one from the result represented by the point a, but the construction term is greatly shortened. In the case of the result represented by point c, the cost is high because the number of dump trucks is increased by one from the result represented by point b, but the construction term is not shortened so much. In other words, a user can understand that an effect of shortening the construction term cannot be obtained even though the number of dump trucks is increased more than the construction condition or basic unit data at the point b. A user can select a construction condition or basic unit data at the point a in which the cost is prioritized, or can select a construction condition or a basic unit data at the point b in which the construction term is prioritized.

As described above, according to the present embodiment, construction amount data is calculated from current topography data and design topography data, and specifications of resources such as work machines used for construction in a construction site, that is, basic unit data corresponding to data indicating specifications of related resources in order to construct the construction site is acquired from a database of the basic unit data, and then the construction condition data is set by the user. Therefore, the simulation unit 17 can simulate a transition state including one or both of a site state of the construction site and an operation state of a work machine on the basis of the basic unit data, construction condition data, and construction amount data. Since a simulation result of the simulation unit is displayed on the output device 3, the simulation result of planned construction is visualized. With visualization of the simulation result of the planned construction, a user can confirm a transition state of construction based on the construction condition set by the user. Referring to the simulation result, the user can determine whether the construction condition set by the user is optimal. In a case where the user is a supervisor of a construction site, the user can reexamine the number of work machines and the number of workers by looking at the simulation result. Additionally, referring to a simulation result, the user inputs a new construction condition by operating the input device 4 while considering a cost and a construction term such that a more preferable simulation result can be obtained, and can make the simulation system 1 to perform simulation again. Consequently, productivity in a construction site can be improved.

Furthermore, according to the present embodiment, the simulation unit 17 calculates construction efficiency including at least one of a cost, man hours, and construction term required for construction on the basis of basic unit data, construction condition data, and construction amount data. Since a simulation result of the simulation unit is displayed on the output device 3, a user can confirm construction efficiency based on a construction condition set by the user. Referring to the simulation result, the user can determine whether the construction condition set by the user is optimal. Referring to the simulation result, the user can reexamine, for example, the number of work machines or the number of workers so as to improve the construction efficiency, and can input a new construction condition by operating the input device 4 while considering a cost and a construction term such that a more preferable simulation result of construction efficiency can be obtained, and can make the simulation system 1 to perform simulation again.

Additionally, according to the present embodiment, the construction condition data includes at least one of a soil property of a construction site and a travel route of a work machine. Depending on the soil property of the construction site, construction becomes more difficult and a progress rate of construction is changed. Simulation accuracy is improved by inputting a soil property of a construction site as construction condition data. Furthermore, the progress rate of construction is also changed depending on a moving track of a work machine in a construction kind area. A moving track of a construction machine such as an excavator is designated by a user via a moving track pattern 27 as the construction condition data, thereby improving simulation accuracy. Also, in a case where a haulage vehicle does not travel with high efficiency, the progress rate of construction is degraded. For example, in a case where a haulage vehicle does not efficiently move between an excavation place by a construction machine and an unloading place where excavated earth and sand are unloaded, a waste time during which loading work by the construction machine is stopped will be increased. Therefore, the progress rate of construction is changed also by a travel route of a haulage vehicle. A travel route 33 optimal for a current state of a construction site can be set and construction efficiency can be obtained with high accuracy by a user performing designation of a travel start point P1, designation of a travel finish point P2, designation in the travel designation field 30, designation in the standby place designation field 31, designation in the stock amount designation field 40, and input in the road surface input field 32. Since the optimal travel route 33 is set as the construction condition data, the simulation accuracy is improved.

In the present embodiment, when a construction period (construction term) is set as the construction condition data, a user operates the input device 4 to input a construction start time point and a construction completion time point, thereby setting the construction period. The user may input the construction start time point by operating the input device 4 and may not necessarily input the construction completion time point. As far as the construction start time point is input, the simulation unit 17 can calculate the construction completion time point by performing simulation on the basis of basic unit data, construction condition data, and construction amount data.

Furthermore, in a case where the number of work machines (basic unit) is not planned yet, a user inputs a construction start time point and a construction completion time point, and with this inputting, the simulation unit 17 can calculate, through simulation, the optimal number of work machines such that construction is completed at the construction completion time point.

Second Embodiment

A second embodiment will be described. In the following description, a constituent element same as or equivalent to that of an above-described embodiment will be denoted by a same reference sign, and a description thereof will be simplified or omitted.

In the above-described embodiment, construction condition data is input by a user to a data processing device 2 via an input device 4. In the present embodiment, an example will be described in which a construction condition setting unit 16 sets construction condition data on the basis of basic unit data and construction amount data.

Figure 13:
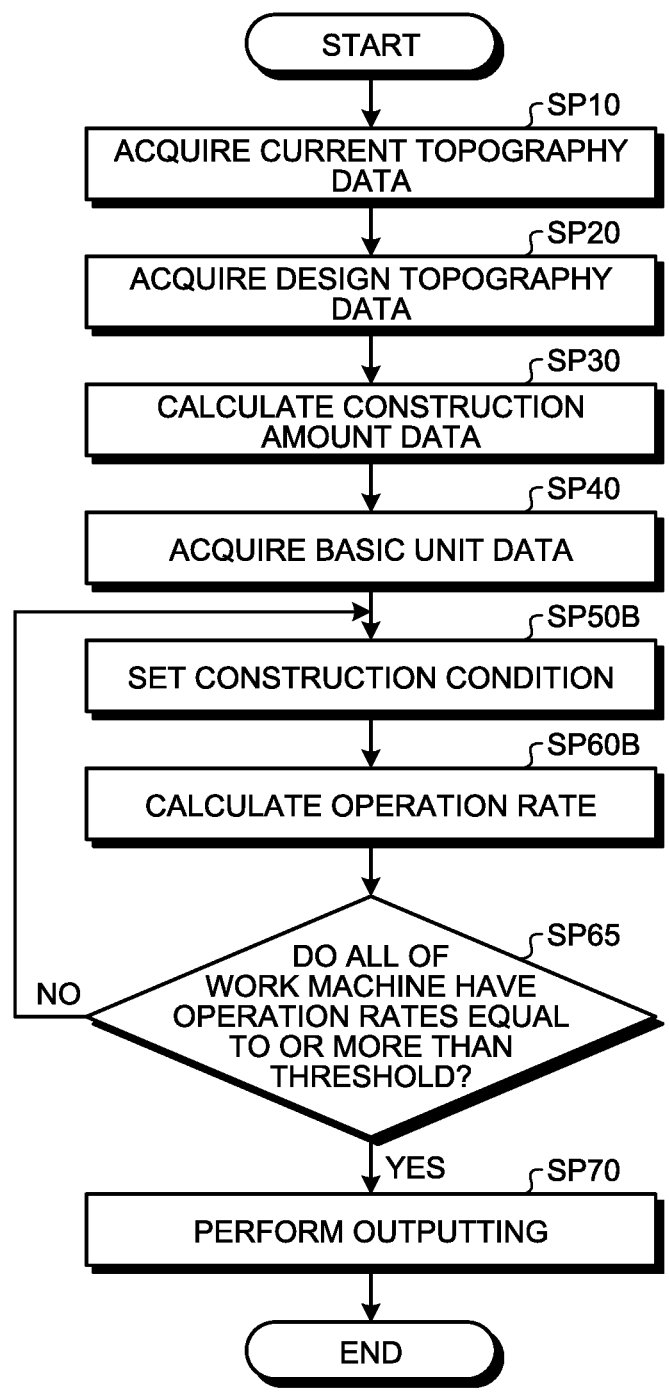
FIG. 13 is a flowchart illustrating an exemplary simulation method according to a second embodiment.

FIG. 13 is a flowchart illustrating an exemplary simulation method according to the present embodiment. Similar to the above-described embodiment, current topography data is acquired (step SP10), design topography data is acquired (step SP20), construction amount data is calculated (step SP30), and basic unit data is acquired (step SP40).

The basic unit data includes a type and the number of work machines to be used. In the present embodiment, a basic unit data acquisition unit 15 selects a type and the number of the work machines to be used from a database of the basic unit data stored in a storage unit 19. For example, the storage unit 19 stores a working machine list indicating a type and the number of work machines set in accordance with a scale of a construction site, and the basic unit data acquisition unit 15 acquires, from a plurality of working machine lists, an arbitrary working machine list. Similar to the above embodiment, a type and the number of the work machines to be used may be designated by a user.

In the present embodiment, the construction condition setting unit 16 sets a construction condition (step SP50B) different from the first embodiment. In the present embodiment, list data of the construction procedures is stored in the storage unit 19. The construction condition setting unit 16 selects an arbitrary construction procedure from the list data of the construction procedures and sets a selected construction procedure as construction condition data. Meanwhile, soil property list data in a construction site and travel route list data of a work machine are stored in the storage unit 19, and the construction condition setting unit 16 may select an arbitrary soil property and an arbitrary travel route of a work machine from these list data.

A simulation unit 17 simulates a transition state and construction efficiency of a construction site on the basis of basic unit data acquired by a basic unit data acquisition unit 13, construction amount data calculated by a construction amount data calculation unit 15, and construction condition data set by the construction condition setting unit 16. In the present embodiment, the simulation unit 17 calculates operation rate data representing an operation rate of a work machine to be used in a construction site (step SP60B).

The simulation unit 17 determines whether at least one work machine has an operation rate equal to or more than a predetermined threshold (step SP65). For example, in a case where one work machine is planned to be used, it is determined whether the one work machine has an operation rate equal to or more than the predetermined threshold. Alternatively, for example, in a case where N work machines are planned to be used, it is determined whether all of the N work machines have operation rates equal to or more than the threshold. Furthermore, for example, in a case where N work machines are planned to be used, it may be determined whether only a specific work machine out of the N machines has an operation rate equal to or more than the predetermined threshold. In this case, for example, in a case where there are five work machines planned to be used in total including three excavators and two bulldozers as work machines, it may be determined whether the three excavators are set as specific work machines, and all of the three excavators have operation rates equal to or more than the predetermined threshold. A specific work machine is set by, for example, a user operating the input device 4 to designate the specific work machine and the construction condition setting unit 16 recognizing the specified work machine via the input data acquisition unit 14.

In step SP65, in a case where it is determined that all of work machine have the operation rates equal to or more than the threshold (step SP65: Yes), the output control unit 18 causes the output device 3 to display a simulation result of the simulation unit 17 (step SP70).

In step SP65, in a case where it is determined that all of the work machines have operation rates not equal to or more than the threshold or more (step SP65: No), the construction condition setting unit 16 changes a construction condition and sets the changed construction condition (step SP50B).

The simulation unit 17 performs simulation on the basis of the reset construction condition data and calculates operation rate data of a work machine (step SP60B).

The data processing device 2 performs the processing of step SP50B, step SP60B, and step SP65 until an operation rate of a work machine becomes the threshold or more.

As described above, in the present embodiment, the construction condition setting unit 16 sets construction condition data on the basis of operation rate data calculated by the simulation unit 17 such that an operation rate of a work machine becomes the threshold or more. In the present embodiment, as far as construction amount data and basic unit data are acquired, the data processing device 2 automatically calculates an optimal construction condition in which an operation rate of a work machine becomes the threshold or more. Consequently, the simulation system 1 can provide a user with the optimal construction condition.

Note that basic unit data may be corrected or updated in the above embodiments. For example, a basic unit of a work machine and proficiency of a worker registered in the storage unit 19 may be corrected or updated at a predetermined time point after the elapse of a predetermined period from start of actual construction on the basis of actual construction achievement or a detection result of each kind of sensors during a period from the time point of starting the construction to the predetermined time point. The simulation unit 17 may perform simulation again on the basis of basic unit of a work machine and proficiency of a worker after correction or updating the basic unit and the proficiency.

In the embodiments described above, the simulation unit 17 calculates a transition state and construction efficiency of a construction site, but may separately calculate each of a transition state and construction efficiency of a construction site.

Meanwhile, in the above embodiments, the examples in which the output device 3 is a display device has been mainly described. The output device 3 may also be a printing device. Output by the output device 3 includes printing (print-out) by the printing device. In other words, display data (image data and character data) displayed on the output device 3 described in the above-described embodiments may be output as printed matters.

REFERENCE SIGNS LIST

1 SIMULATION SYSTEM
2 DATA PROCESSING DEVICE
3 OUTPUT DEVICE
4 INPUT DEVICE
5 INTERFACE CIRCUIT
6 PROCESSOR
7 NONVOLATILE MEMORY
8 VOLATILE MEMORY
9 COMPUTER PROGRAM
10 INPUT/OUTPUT UNIT
11 CURRENT TOPOGRAPHY DATA ACQUISITION UNIT
12 DESIGN TOPOGRAPHY DATA ACQUISITION UNIT
13 BASIC UNIT DATA ACQUISITION UNIT
14 INPUT DATA ACQUISITION UNIT
15 CONSTRUCTION AMOUNT DATA CALCULATION UNIT
16 CONSTRUCTION CONDITION SETTING UNIT
17 SIMULATION UNIT
18 OUTPUT CONTROL UNIT
19 STORAGE UNIT
21 CUT REGION
22 EMBANKMENT REGION
23 WORK VEHICLE LIST
24 WORK MACHINE LIST
25 WORK CONTENT LIST
26 CONSTRUCTION KIND AREA LIST
27 MOVING TRACK PATTERN
28 SOIL PROPERTY LIST
29 DIVISION WIDTH DESIGNATION FIELD
30 TRAVEL DESIGNATION FIELD
31 STANDBY PLACE DESIGNATION FIELD
32 ROAD SURFACE INPUT FIELD
33 TRAVEL ROUTE

The invention claimed is:

1. A simulation system comprising:
a memory; and
a processor coupled to the memory and configured to:
acquire current topography data indicating a current topography of a construction site,
acquire design topography data indicating a design topography of the construction site from the interface,
calculate construction amount data including a cut area and a cut amount on the current topography, and an embankment area and an embankment amount on the current topography, on the basis of the current topography and the design topography,
cause a display device to three-dimensionally display a cut region indicating a range to be cut and an embankment region indicating a range to be banked in different colors as the construction amount data,
cause the display device to display a standby place designation field to make the user designate whether there is any place where the haulage vehicle can stand by, and a stock soil amount designation field to designate a maximum stock amount at a time of accumulating earth and sand that have been cut or a maximum stock amount at a time of accumulating earth and sand for embankment,
acquire basic unit data selected by an input device, from a database of the basic unit data stored in the memory, the basic unit data including a type of each work machine and proficiency of each worker,
acquire construction condition data including construction procedures set by the input device,
simulate a topography of the construction site changed in accordance with construction progress every predetermined period, and an operation state of a work machine including an operation rate, on the basis of the basic unit data, the construction condition data, and the construction amount data,
generate display data of simulation results, display data of the current topography data and the design topography data in a superimposed manner, and display data of a three-dimensional display of the current topography data, the design topography data, and the construction amount data, displayable on the display device, and
output the generated display data every predetermined period to the output device, wherein the processor outputs the display data to the display device by using meshes as a plurality of blocks partitioned in accordance with mesh division designated by the user, and changes a position and a number of the blocks in the plurality of blocks in accordance with movement of earth and sand in a manner correlated to an elapsed time from a construction start time point to display moving image data of the topography of the construction site that is changed in accordance with progress of construction, to visualize change in the topography of the construction site,
wherein the user inputs a construction period having a start time point and a completion time point, and with this inputting, through simulation the operation state of the work machine every predetermined period during the construction period, the processor calculates an optimal number of work machines such that construction is completed during the construction period.

2. The simulation system according to claim 1, wherein the processor calculates a transition state of the construction site on the basis of the basic unit data, the construction condition data, and the construction amount data, and the transition state includes one or both of a site state of the construction site and the operation state of the work machine.

3. The simulation system according to claim 1, wherein
the processor sets construction condition data indicating construction procedures;
the processor calculates construction efficiency at a time of performing construction of the construction amount, on the basis of the basic unit data, the construction condition data, and the construction amount data; and
the processor generates the display data that can be displayed on the output device from the calculation data of the construction efficiency, and
the processor outputs the display data to the output device, wherein the processor simulates at least one of cost, man-hours, and construction term required for construction on the basis of the basic unit data, construction condition data, and construction amount data.

4. The simulation system according to claim 1, wherein the processor performs simulation a plurality of times while changing the construction condition data or the basic unit data.

5. The simulation system according to claim 1, wherein the construction condition data includes at least one of a soil property of the construction site and a travel route of the work machine.

6. The simulation system according to claim 1, wherein
the processor acquires input data generated by an input device being operated,
wherein the construction condition data includes the input data.

7. The simulation system according to claim 1, wherein
the processor calculates operation rate data of the work machine, and
the processor sets the construction condition data on the basis of the operation rate data such that the operation rate of the work machine becomes a threshold or more.

8. The simulation system according to claim 1, wherein the processor acquires basic unit data indicating construction capacity of each of: a construction machine capable of dozing or excavating earth and sand; and a haulage vehicle capable of hauling earth and sand.

9. The simulation system according to claim 1, wherein the construction condition data includes a construction condition of a haulage vehicle capable of hauling earth and sand cut on the cut area to the embankment area.

10. The simulation system according to claim 1, wherein the cut amount and the embankment amount on the current topography are calculated from a difference between the current topography and the design topography.

11. The simulation system according to claim 1, wherein the processor outputs moving image data of simulation results to the display device.

12. The simulation system according to claim 1, wherein the processor generates display data of simulation results includes a three-dimensional display of the current topography data and the construction amount data, the embankment area and the cut area, in a superimposed manner.

13. The simulation system according to claim 1, wherein the processor acquires construction condition data including construction procedures set by the input device, the construction condition data including a travel route of the work machine.

14. A simulation method executed by a processor, the method comprising:
acquiring current topography data indicating a current topography of a construction site,
acquiring design topography data indicating a design topography of the construction site from an interface,
calculating construction amount data including a cut area and a cut amount on the current topography, and an embankment area and an embankment amount on the current topography, on the basis of the current topography and the design topography,
causing a display device to three-dimensionally display a cut region indicating a range to be cut and an embankment region indicating a range to be banked in different colors as the construction amount data,
causing the display device to display a standby place designation field to make the user designate whether there is any place where the haulage vehicle can stand by, and a stock soil amount designation field to designate a maximum stock amount at a time of accumulating earth and sand that have been cut or a maximum stock amount at a time of accumulating earth and sand for embankment,
acquiring basic unit data selected by an input device, from a database of the basic unit data stored in the memory, the basic unit data including a type of each work machine and proficiency of each worker,
acquiring construction condition data including construction procedures set by the input device,
simulating a topography of the construction site changed in accordance with construction progress every predetermined period, and an operation state of a work machine including an operation rate, on the basis of the basic unit data, construction condition data, and construction amount data,
generating display data of simulation results, display data of the current topography data and the design topography data in a superimposed manner, and display data of a three-dimensional display of the current topography data, the design topography data, and the construction amount data, displayable on the display device, and
outputting the generated display data to the display device every predetermined period,
wherein outputting the display data to the display device by using meshes as a plurality of blocks partitioned in accordance with mesh division designated by a user, and changes a position and a number of the blocks in the plurality of blocks in accordance with movement of earth and sand in a manner correlated to an elapsed time from the construction start time point to display moving image data of the topography of the construction site that is changed in accordance with progress of construction, to visualize change in the topography of the construction site,
wherein the user inputs a construction period having a start time point and a completion time point, and with this inputting, through simulation the operation state of the work machine every predetermined period during the construction period, the processor calculates an optimal number of work machines such that construction is completed during the construction period.

15. The simulation method according to claim 14, wherein generating display data of simulation results includes a three-dimensional display of the current topography data and the construction amount data, the embankment area and the cut area, in a superimposed manner.

16. The simulation method according to claim 14, wherein acquiring construction condition data including construction procedures set by the input device, the construction condition data including a travel route of the work machine.

\* \* \* \* \*